(12) United States Patent
Joe et al.

(10) Patent No.: US 7,964,441 B2
(45) Date of Patent: Jun. 21, 2011

(54) CATALYST-ASSISTED ATOMIC LAYER DEPOSITION OF SILICON-CONTAINING FILMS WITH INTEGRATED IN-SITU REACTIVE TREATMENT

(75) Inventors: Raymond Joe, Austin, TX (US); Meenakshisundaram Gandhi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 741 days.

(21) Appl. No.: 11/693,891

(22) Filed: Mar. 30, 2007

(65) Prior Publication Data

US 2008/0241358 A1    Oct. 2, 2008

(51) Int. Cl.
 *H01L 51/40* (2006.01)
(52) U.S. Cl. ............... 438/99; 257/40; 257/E51.024; 257/E51.027; 257/E51.046; 427/96.8
(58) Field of Classification Search ............ 427/96.8; 257/40, E51.024, E51.027, E51.046; 438/99
See application file for complete search history.

(56) References Cited

U.S. PATENT DOCUMENTS

| | | | | |
|---|---|---|---|---|
| 6,090,442 | A * | 7/2000 | Klaus et al. | 427/255.15 |
| 6,660,338 | B1 * | 12/2003 | Hargreaves | 427/399 |
| 6,818,250 | B2 | 11/2004 | George et al. | |
| 6,992,019 | B2 | 1/2006 | Lee et al. | |
| 2005/0271893 | A1 * | 12/2005 | Kobrin et al. | 428/633 |
| 2006/0090694 | A1 | 5/2006 | Cho et al. | |

OTHER PUBLICATIONS

J. Park et al., "Mass-Productive Ultra-Low Temperature ALD $SiO_2$ Process Promising for Sub-90nm Memory and Logic Devices", Electronic Devices Meeting, IEDM 2002, pp. 229-232. (2002).
Y. Kim et al. "A Novel Method for Forming Gate Spacer and its Effects on the W/WNx/Poly-Si Gate Stack," Proceedings of the 34th European Solid-State Device Research Conference, pp. 97-100. (2004).
J. W. Klaus et al. "Growth of $SiO_2$ at Room Temperature with the Use of Catalyzed Sequential Half-Reactions," Science, vol. 278, pp. 1934-1936. (1997).

* cited by examiner

*Primary Examiner* — Matthew C Landau
*Assistant Examiner* — Colleen E Snow
(74) *Attorney, Agent, or Firm* — Oblon, Spivak, McClelland, Maier & Neustadt, L.L.P.

(57) ABSTRACT

A method is provided for low temperature catalyst-assisted atomic layer deposition of silicon-containing films such as $SiO_2$ and SiN. The method includes exposing a substrate surface containing X—H functional groups to a first $R_1$—X—$R_2$ catalyst and a gas containing silicon and chlorine to form an X/silicon/chlorine complex on the surface, and forming a silicon-X layer terminated with the X—H functional groups by exposing the X/silicon/chlorine complex on the substrate surface to a second $R_1$—X—$R_2$ catalyst and a X—H functional group precursor. The method further includes one or more integrated in-situ reactive treatments that reduce or eliminate the need for undesired high-temperature post-deposition processing. One reactive treatment includes hydrogenating unreacted X—H functional groups and removing carbon and chlorine impurities from the substrate surface. Another reactive treatment saturates the silicon-X layer with additional X—H functional groups.

7 Claims, 7 Drawing Sheets

CATALYST-ASSISTED ATOMIC LAYER DEPOSITION OF SILICON-CONTAINING FILMS WITH INTEGRATED IN-SITU REACTIVE TREATMENT

FIELD OF THE INVENTION

The present invention relates to thin film deposition, and more particularly to low temperature catalyst-assisted deposition of silicon-containing films such as silicon nitride and silicon oxide.

BACKGROUND OF THE INVENTION

The reduction of thin films to nanometer dimensions for new technologies requires excellent control of film thickness, morphology, crystallinity, and conformality. Many of these requirements can be achieved by growth controlled at single atomic layers by means of binary reaction sequence chemistry. Furthermore, low deposition temperatures are often required, for example due to restricted thermal budget and interlayer diffusion that may destroy the properties of nanoscale devices. Atomic layer deposition (ALD) may be preferred or required for some advanced manufacturing processes due to its superior conformal deposition and film thickness control, and current ALD processes are often performed at lower temperatures than chemical vapor deposition (CVD) processes. However, these ALD processes are often at temperatures too high to prevent unwanted oxidation of a substrate.

Silicon nitride (SiN) films are widely used in semiconductor devices and ultra-large-scale integrated (ULSI) circuits. For example, silicon nitride films have been widely used in semiconductor devices as diffusion barriers for dopants and metals, as etch-stop films during etching of fine features, as final passivation films for encapsulation of fabricated devices, and in many other ways.

Silicon dioxide ($SiO_2$) is the preferred dielectric material for many current and future microelectronic devices. Conformal $SiO_2$ films may be used as interface layers in high aspect ratio trench capacitors to extend dynamic random access memory (DRAM) to the 1-gigabyte regime. Uniform $SiO_2$ films appear on extremely large substrates for flat panel displays. Furthermore, very thin $SiO_2$ films can be used in multilayer and nanolaminate structures to tailor mechanical, electrical, and optical thin film properties. Low-temperature $SiO_2$ deposition techniques will facilitate the use of a $SiO_2$ film as a protective coating or insulator on polymeric or biological materials.

In ALD, self-terminating surface reactions applied in a binary reaction sequence can be used to achieve atomic layer control of thin film growth. Prior work on $SiO_2$ atomic layer-controlled growth has focused on dividing the $SiCl_4 + 2H_2O \rightarrow SiO_2 + 4HCl$ reaction into two half-reactions:

(A)

(B)

where the asterisks (*) designate the surface species. The $SiCl_4$ and $H_2O$ half-reactions are performed in an ABAB ... binary sequence to grow a $SiO_2$ film with a desired thickness.

In each half-reaction, a gas-phase precursor reacts with a surface functional group. The surface reaction continues until the initial surface functional groups (Si—OH) have reacted and have been replaced with the new functional groups (Si—Cl*). The half-reactions are self-limiting; once a half-reaction goes to completion, additional reactant produces no additional film growth. Successive application of the A and B half-reactions has produced atomic layer-controlled $SiO_2$ deposition. Atomic force microscope (AFM) images have revealed that the $SiO_2$ films deposited on Si(100) by ALD can be highly conformal and extremely smooth.

Drawbacks of $SiO_2$ atomic layer-controlled growth include the high substrate temperatures (>300° C.) and large reactant exposures (>$10^9$ Langmuirs (1 L=$10^{-6}$ Torr-sec)) required for the surface half-reactions to reach completion. Recent discoveries have demonstrated that the high reaction temperatures and large precursor fluxes can be avoided by catalyzing the surface reactions. In one example, organic base pyridine ($C_5H_5N$) may be utilized as a catalyst as pyridine interacts strongly with the surface functional groups and reactants present during both the A and B half-reactions of the binary reaction sequence. As a result, $SiO_2$ films have been deposited by means of such catalyzed binary reaction sequence chemistry at temperatures below about 100° C. or even as low as room temperature using greatly reduced reactant flux required for complete reactions.

However, catalyst-based ALD of $SiO_2$ film in the prior art suffers from several drawbacks. For example, chlorine (Cl) and carbon (C) impurities are frequently incorporated into the $SiO_2$ film during deposition, where the carbon impurities likely originate from undesirable decomposition of the catalyst. Post-deposition processing such as high temperature oxidation may be required to remove these impurities and any film defects associated with impurity incorporation, and to further improve the material and electrical properties of the deposited $SiO_2$ film. However, high temperature post-deposition processing may not be possible or desired since it can exceed the thermal budget needed for temperature sensitive materials and manufacturing processes. Furthermore, high temperature post-deposition processing can reduce or eliminate the benefits gained by the low temperature catalyst-assisted ALD processing, in particular if long processing times are required for the post-deposition processing. For example, high-temperature post-deposition processing has been observed to increase gate oxide thickness.

As a result, there is a need for improving catalyst-based ALD of silicon-containing films, such as $SiO_2$ and SiN films, that reduces or eliminates undesired high-temperature post-deposition processing performed to remove film impurities and film defects associated with impurity incorporation.

SUMMARY OF THE INVENTION

Embodiments of the invention address the aforenoted need by providing an improved method of low temperature catalyst-assisted deposition of silicon-containing films such as $SiO_2$ and SiN films where the method reduces or eliminates the need for undesired high-temperature post-deposition processing.

According to an embodiment of the invention, a method is provided for depositing a silicon-containing film on a substrate comprising X—H functional groups on a surface thereof using catalyst-assisted atomic layer deposition. The method includes exposing the substrate surface to a first $R_1$—X—$R_2$ catalyst and a gas containing silicon and chlorine to form an X/silicon/chlorine complex on the surface, and forming a silicon-X layer terminated with the X—H functional groups by exposing the X/silicon/chlorine complex on the substrate surface to a second $R_1$—X—$R_2$ catalyst and a X—H functional group precursor. The method further includes one or more integrated in-situ reactive treatments that reduce or eliminate the need for undesired high-temperature post-deposition processing. One reactive treatment includes hydrogenating unreacted X—H functional groups and removing carbon and chlorine impurities from the substrate surface. Another reactive treatment saturates the silicon-X layer with additional X—H functional groups.

According to one embodiment of the invention, a method (X=O) is provided for catalyst-assisted atomic layer deposition of a $SiO_2$ film on a substrate having hydroxyl functional groups on a surface thereof, where the first and second $R_1$—O—$R_2$ catalysts may be selected from furan and ethers.

According to another embodiment of the invention, a method (X=N) is provided for catalyst-assisted atomic layer deposition of a SiN film on a substrate having N—H functional groups on a surface thereof, where the first and second $R_1$—N—$R_2$ catalysts may be selected from pyridine and tertiary amines.

DETAILED DESCRIPTION OF SEVERAL EMBODIMENTS OF THE INVENTION

Embodiments of the invention provide a method of depositing a silicon-containing film on a functionalized substrate at room temperature or near room temperature using catalyst-based ALD integrated with one or more in-situ reactive treatment(s). Due to the reduced impurity levels in the as-deposited silicon-containing films, high-temperature post-deposition processing may be reduced or eliminated, thereby maximizing the benefits gained by the low temperature catalyst-assisted ALD processing provided by embodiments of the invention.

Using catalyst-assisted ALD of a $SiO_2$ film as an example for a silicon-containing film, catalyzed self-terminating surface reactions applied in a binary reaction sequence have focused on dividing a $SiCl_4+2H_2O \rightarrow SiO_2+4HCl$ reaction into two half-reactions:

(A)

(B)

where the asterisks designate the surface species and the half-reactions are performed in an ABAB . . . binary sequence to grow a $SiO_2$ film with a desired thickness.

However, as demonstrated by the need for performing post-deposition processing to remove hydroxyl groups and chlorine impurities from the deposited $SiO_2$ films, the half-reactions (A) and (B) do not proceed to completion and unreacted Si—OH and Si—Cl groups become embedded in the $SiO_2$ film during the ALD processing. In other words, chlorine impurity incorporation into the $SiO_2$ film indicates incomplete chlorine removal by the reaction between Si—Cl* and $H_2O$, and hydroxyl groups incorporation indicates incomplete reaction between Si—OH* and $SiCl_4$. Fourier-transform infra-red (FTIR) spectroscopy has revealed the presence of hydroxyl groups on or within an as-deposited $SiO_2$ film which can negatively affect the etching characteristics of the $SiO_2$ film. In one example, the etch character of a $SiO_2$ film was improved by a post-deposition annealing process at 700° C. that densified and dehydrogenated the as-deposited $SiO_2$ film.

Embodiments of the invention provide in-situ reactive treatments that reduce the amount of unreacted Si—OH and Si—Cl groups that would otherwise become embedded in the $SiO_2$ film and require post-processing to remove from the film. As one skilled in the art will readily recognize, ALD processing that includes half-reaction (B) may not be effective in removing impurities such as carbon (C) and chlorine from the $SiO_2$ film because the half-reaction is constructed to strictly take place between the surface chlorine and $H_2O$.

A reactive treatment may be performed following half-reaction (A) to dehydrogenate (remove hydrogen and replace with chlorine) unreacted hydroxyl functional groups, and remove carbon and chlorine impurities from the substrate surface. Another reactive treatment may be performed following or during half-reaction (B) to saturate the silicon oxide layer with additional hydroxyl groups.

According to embodiments of the invention, one or more $R_1$—O—$R_2$ catalyst(s) are utilized to catalyze the $SiO_2$ ALD process by activating surface species to lower the required temperature and flow of reactants needed. It is anticipated that the $R_1$—O—$R_2$ catalysts used to deposit $SiO_2$ films in embodiments of the invention can provide increased catalytic effects over $R_1$—N—$R_2$ catalysts due to the increased nucleophilic attack angle from the two electron lone pairs on the oxygen atom, compared to the one electron lone pair on the nitrogen atom. The one or more $R_1$—O—$R_2$ catalyst(s) can include furan ($C_4H_4O$), which is a cyclic aromatic compound, and ethers. Ethers belong to a class of organic compounds in which two hydrocarbons are linked by an oxygen atom. Common ethers include dimethyl ether ($CH_3OCH_3$, DME) and tetrahydrofuran ($C_4H_8O$, THF). The terms "primary ether", "secondary ether", and "tertiary ether" may be used and refer to the carbon atom next to the ether oxygen. In a primary ether this carbon is connected to only one other carbon as in diethyl ether ($CH_3CH_2OCH_2CH_3$). An example of a secondary ether is di-isopropyl ether (($CH_3)_2$CHOCH($CH_3)_2$) and that of a tertiary ether is di-tert-butyl ether ($(CH_3)_3COC(CH_3)_3$). DME is commercially used as an aerosol spray propellant and exists as a gas under atmospheric temperature and pressure conditions. For comparison, furan and THF are liquids and may be delivered to a deposition chamber using a bubbler or a vaporizer. It should be noted that some references classify furan as a cyclic dienic ether whereas other references describe aromatic compounds such as furan as a class of compounds with the same general structures $R_1$—O—$R_2$ as ethers.

Figure 1:
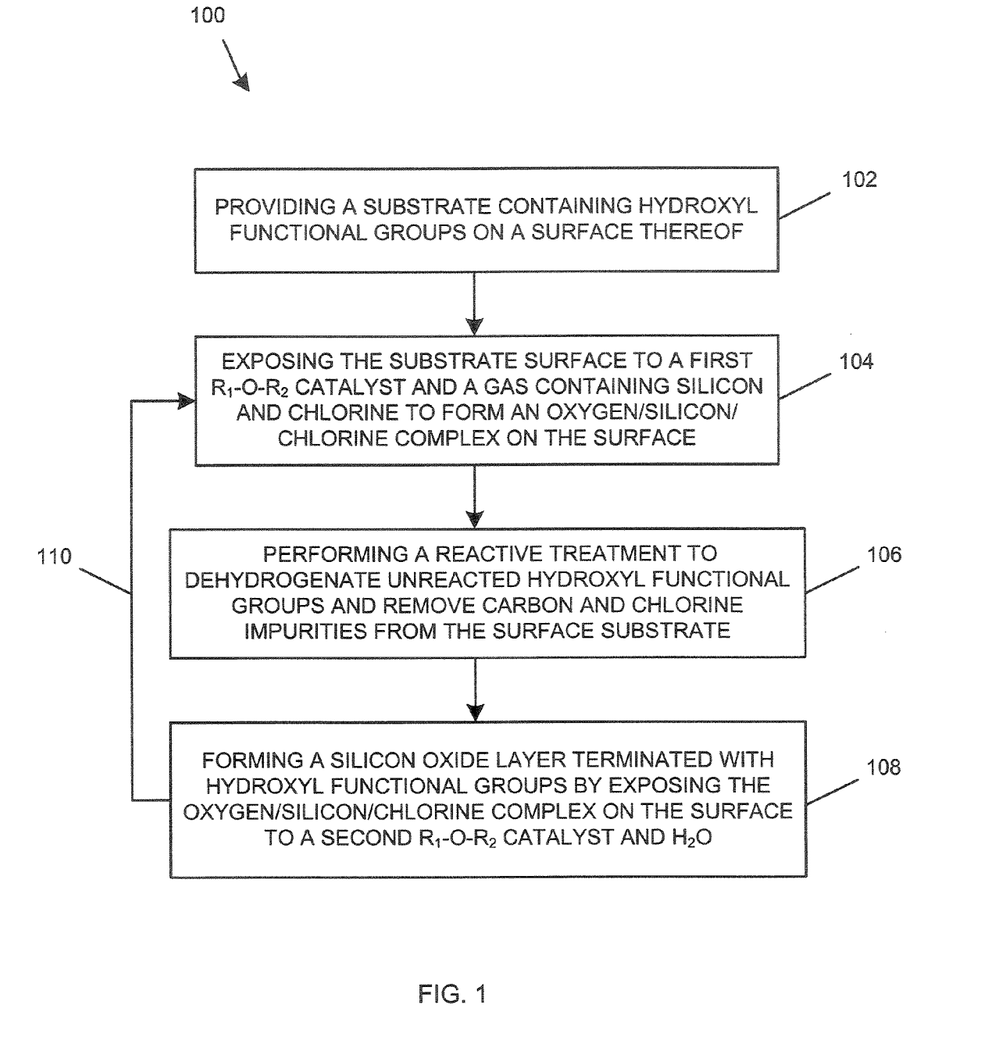
FIGS. 1-3 are process flow diagrams for forming a $SiO_2$ film according to embodiments of the invention.
Figure 2:
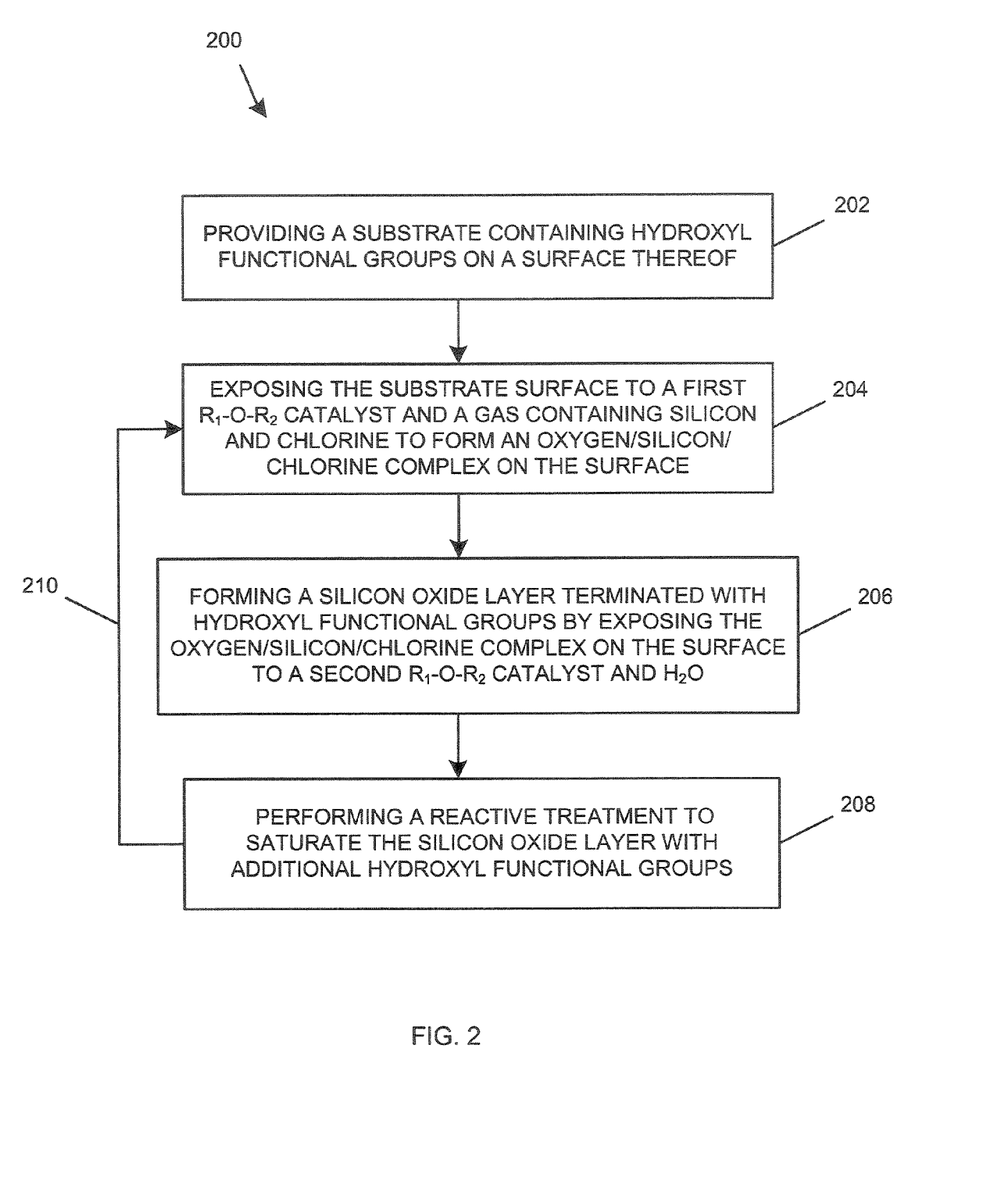
Figure 3:
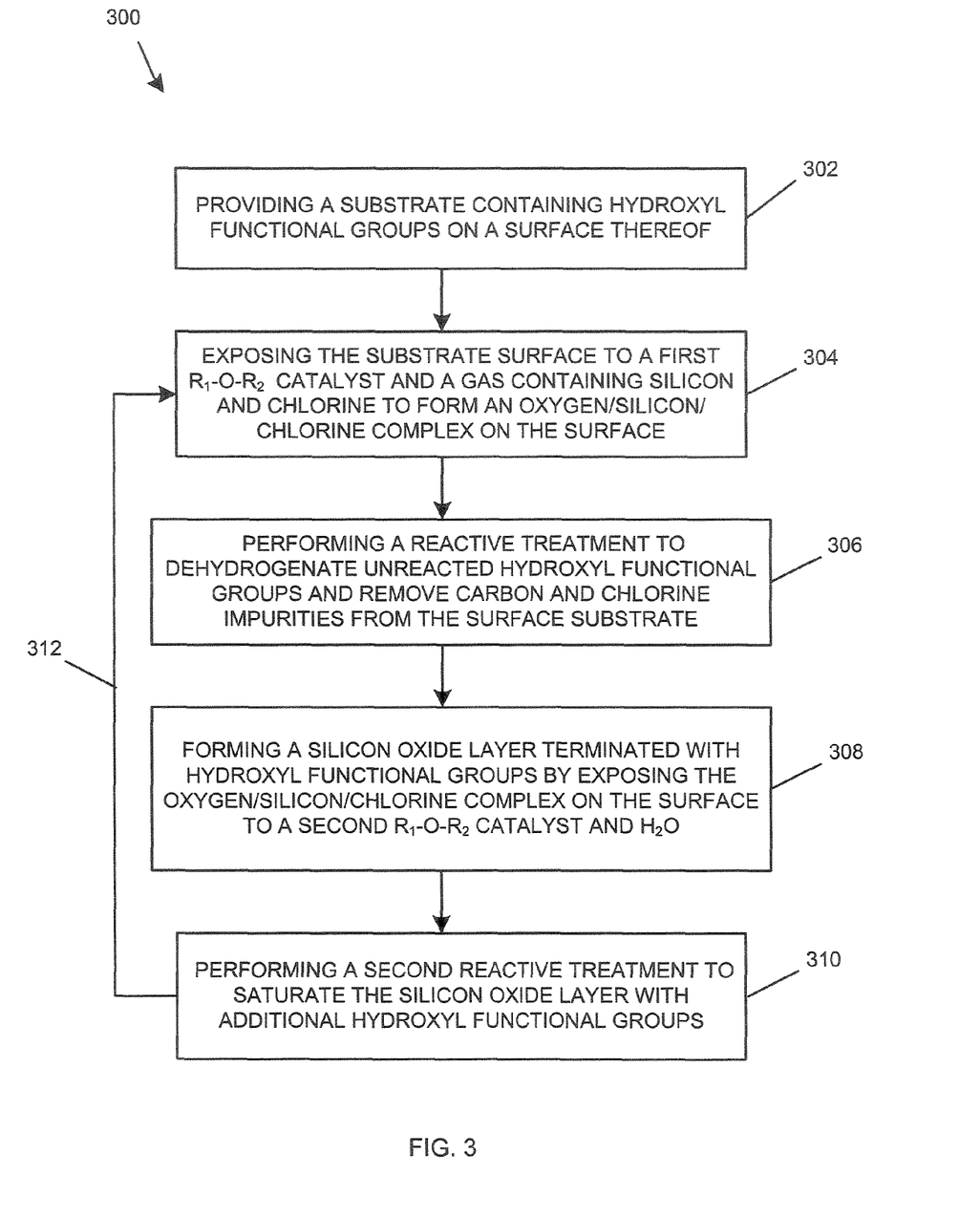

FIGS. 1-3 are process flow diagrams for forming a $SiO_2$ film according to embodiments of the invention. The flow diagrams describe catalyst-assisted deposition of a $SiO_2$ film on a functionalized substrate using one or more in-situ reactive treatments to remove impurities and defects during the film deposition. The substrate may be a Si substrate containing a native oxide layer or a chemical oxide layer on a surface thereof. The substrate may prepared by wet cleaning with methanol and acetone prior to loading into a process chamber of a deposition system. Once in the process chamber, the substrate may be placed on a substrate holder that is configured for maintaining the substrate at a desired temperature during processing.

FIG. 1 is a process flow diagram for forming a $SiO_2$ film according to an embodiment of the invention. In FIG. 1, the process 100 includes, in step 102, providing a substrate containing hydroxyl (—O—H) functional groups on a surface thereof. The substrate surface may be functionalized with hydroxyl functional groups by exposure to H₂O and ozone (O₃) and optionally ultra-violet (UV) radiation. Next, the process chamber is evacuated and purged with nitrogen (N₂) or argon (Ar).

In step 104, the substrate surface is exposed to a first R₁—O—R₂ catalyst and a gas containing silicon and chlorine to form an oxygen/silicon/chlorine (O—Si—Cl) complex on the surface. The first R₁—O—R₂ catalyst can be selected from furan and ethers, and the gas containing silicon and chlorine can be selected from chlorosilanes: SiH$_a$Cl$_{4-a}$ (where a is an integer of 0-3), and chlorodisilanes: Si₂H$_b$Cl$_{6-b}$ (where b is an integer of 0-5). Examples of chlorosilanes and chlorodisilanes include SiHCl₃, SiH₂Cl₂, SiHCl₃, SiCl₄, and Si₂Cl₆. The length of the exposure is selected to saturate the substrate surface with the O—Si—Cl complex. Although the substrate surface is saturated with the O—Si—Cl, it is contemplated that unreacted hydroxyl functional groups are present on the substrate surface at the end of step 104, for example due to steric hindrance effects on the substrate surface.

In step 106, a reactive treatment is performed to dehydrogenate unreacted hydroxyl functional groups and remove carbon and chlorine impurities from the substrate surface. According to an embodiment of the invention, the reactive treatment can include exposing the substrate surface to UV light radiation and a first reactive gas containing chlorine (e.g., Cl₂) to dehydrogenate unreacted hydroxyl functional groups with chlorine, thereby replacing Si—OH functional groups with Si—Cl groups. The reactive treatment generates Cl radicals that are effective in "scavenging" carbon impurities from the substrate surface.

In step 108, a silicon oxide layer terminated with hydroxyl functional groups is formed by exposing the oxygen/silicon/chlorine complex on the substrate surface to a second R₁—O—R₂ catalyst and H₂O. H₂O serves as a X—H functional group precursor (where X is oxygen) by providing the hydroxyl functional groups. As for the first R₁—O—R₂ catalyst in step 104, the second R₁—O—R₂ catalyst in step 108 can be selected from furan and ethers. According to embodiments of the invention, the first and second R₁—O—R₂ catalysts may contain the same R₁—O—R₂ catalyst or, alternately, they may contain different R₁—O—R₂ catalysts.

The process steps 104-108 may be repeated as shown by process flow arrow 110 until a SiO₂ film with a desired thickness is formed. As is well known to one of ordinary skill in the art, purging and/or evacuation steps may be performed between the steps of the process 100.

FIG. 2 is a process flow diagram for forming a SiO₂ film according to an embodiment of the invention, The process 200 in FIG. 2 is similar to the process 100 of FIG. 1 and includes, in step 202, providing a substrate containing hydroxyl functional groups on a surface thereof, and in step 204, the substrate surface is exposed to a first R₁—O—R₂ catalyst and a gas containing silicon and chlorine to form an oxygen/silicon/chlorine complex on the surface.

In step 206, a silicon oxide layer terminated with hydroxyl functional groups is formed by exposing the oxygen/silicon/chlorine complex on the substrate surface to a second R₁—O—R₂ catalyst and H₂O.

In step 208, a reactive treatment is performed to saturate the silicon oxide layer with additional hydroxyl functional groups by exposing the silicon oxide layer to an UV light radiation and a reactive gas comprising H₂O, hydrogen peroxide (H₂O₂), or O₃, or a combination thereof. It is well known by one skilled in the art that O₃ may be effectively utilized as an oxidizer in ALD processing, in particular at temperatures of about 300° C. and higher, but O₃ effectiveness is commonly reduced at lower temperatures, for example below about 100° C. The effectiveness of O₃ in ALD processing may be enhanced using UV radiation and H₂O. The effects of UV radiation activation of the reactive gas enable further saturation of the silicon oxide layer with additional hydroxyl functional groups. The enhanced availability of hydroxyl groups can be schematically shown by the following reactions:

$$O_3 + UV + H_2O \rightarrow O_2 + O^* + H_2O \rightarrow O_2 + 2OH$$

According to one embodiment of the invention, steps 206 and 208 may be sequentially carried out with no temporal overlap. According to another embodiment of the invention, steps 206 and 208 may be carried out with at least partial temporal overlap. According to one embodiment, the steps 206 and 208 may be performed simultaneously.

The process steps 204-208 may be repeated as shown by process flow arrow 210 until a SiO₂ film with a desired thickness is formed on the substrate.

FIG. 3 is a process flow diagram for forming a SiO₂ film according to an embodiment of the invention. The process 300 in FIG. 3 includes both the reactive treatment steps 106, 208 of the processes 100, 200 in FIGS. 1, 2. The process 300 includes, in step 302, providing a substrate containing hydroxyl groups on a surface thereof, and in step 304, the substrate surface is exposed to a first R₁—O—R₂ catalyst and a gas containing silicon and chlorine to form an oxygen/silicon/chlorine complex on the surface.

In step 306, a reactive treatment is performed to dehydrogenate unreacted hydroxyl functional groups and remove carbon and chlorine impurities from the substrate surface. According to an embodiment of the invention, the reactive treatment can include exposing the substrate surface to UV light radiation and a first reactive gas containing chlorine to dehydrogenate unreacted hydroxyl functional groups with chlorine, thereby replacing Si—OH functional groups with Si—Cl groups.

In step 308, a silicon oxide layer terminated with hydroxyl functional groups is formed by exposing the oxygen/silicon/chlorine complex on the substrate surface to a second R₁—O—R₂ catalyst and H₂O.

In step 310, a second reactive treatment is performed to saturate the silicon oxide layer with additional hydroxyl functional groups by exposing the silicon oxide layer to an UV light radiation and a reactive gas comprising H₂O, H₂O₂, or O₃, or a combination thereof.

According to one embodiment of the invention, steps 306 and 308 may be sequentially carried out with no temporal overlap. According to another embodiment of the invention, steps 306 and 308 may be carried out with at least partial temporal overlap. According to one embodiment, the steps 306 and 308 may be performed simultaneously.

The process steps 304-308 may be repeated as shown by process flow arrow 312 until a SiO₂ film with a desired thickness is formed.

Figure 4:
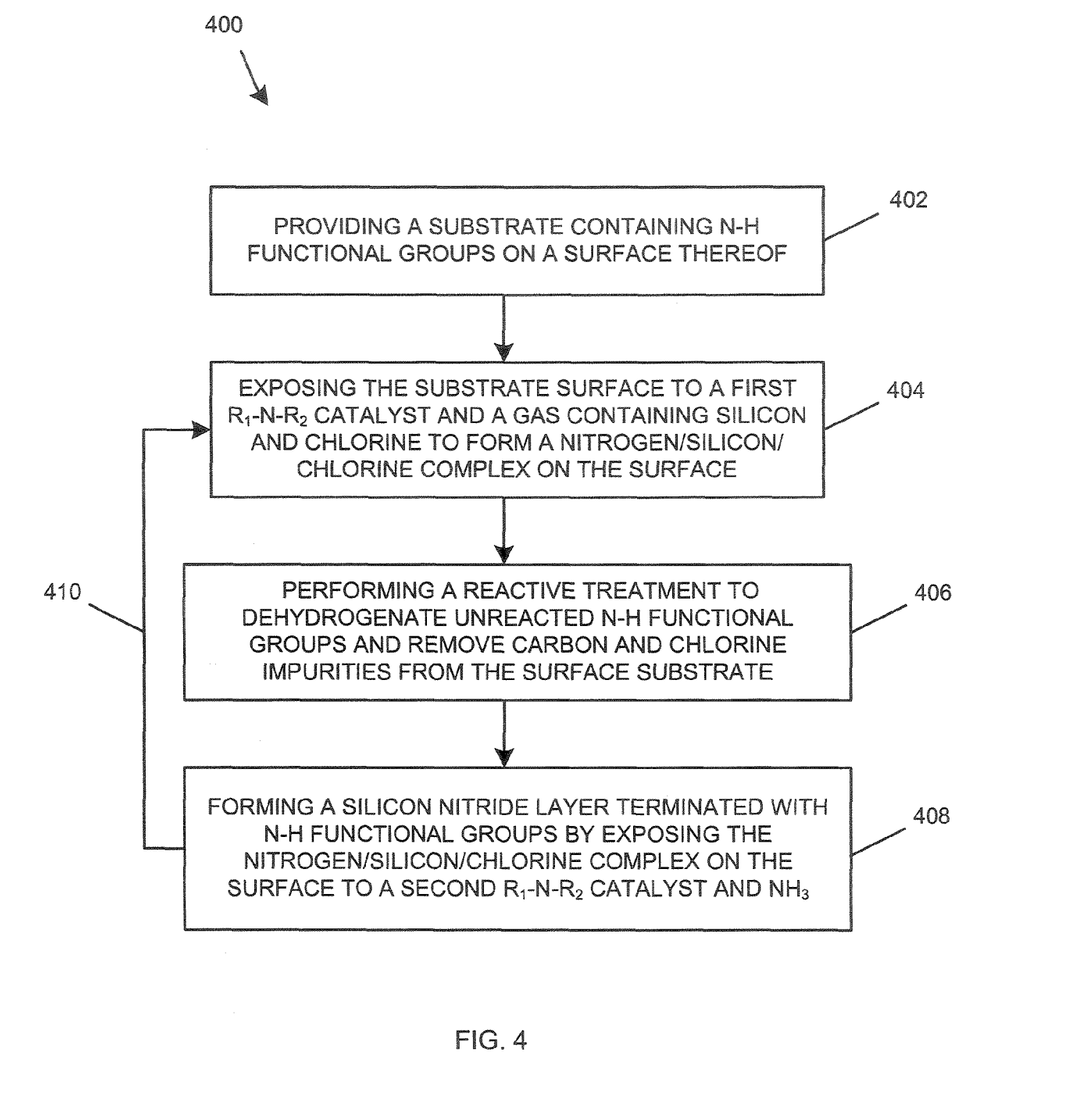
FIGS. 4-6 are process flow diagrams for forming a SiN film according to embodiments of the invention.
Figure 5:
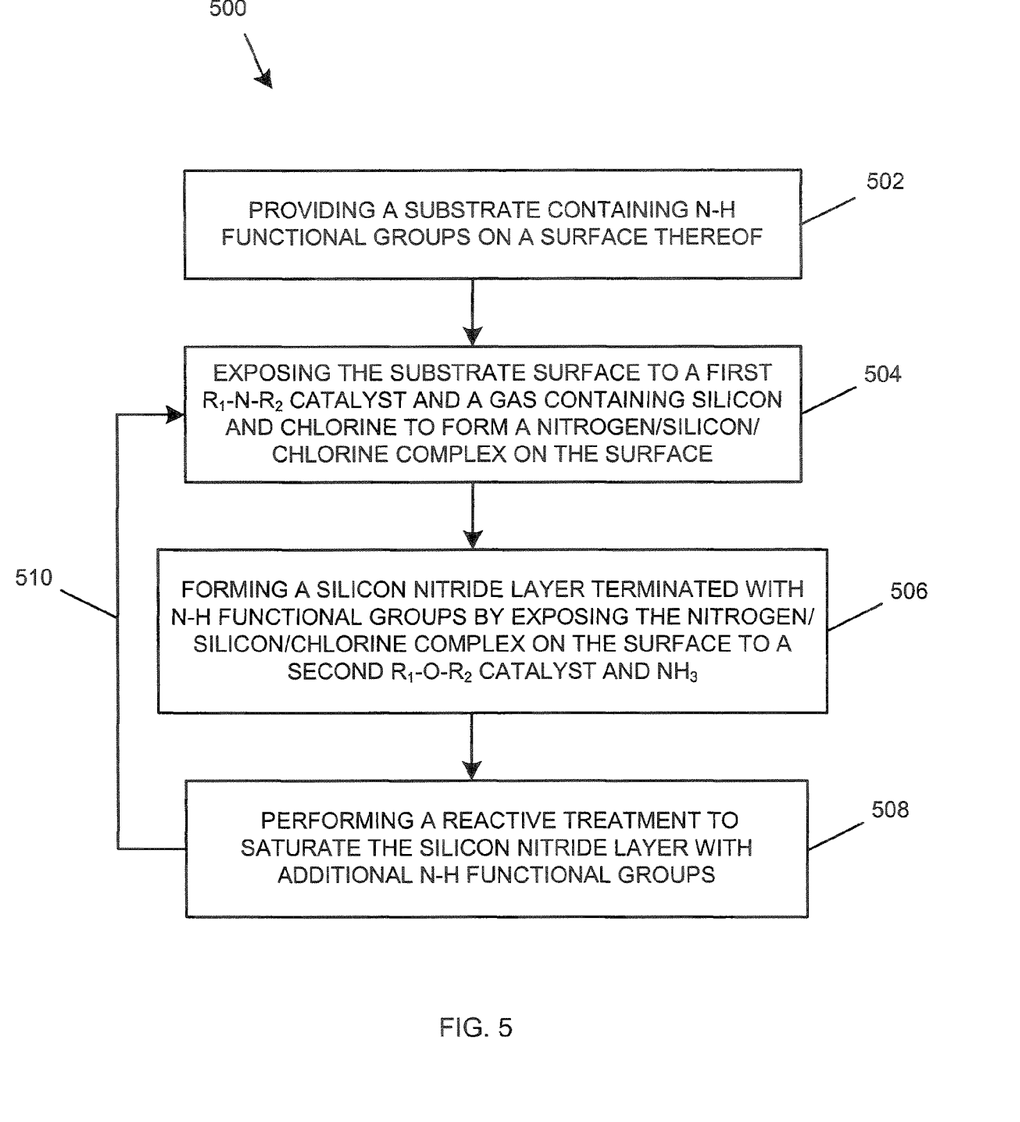
Figure 6:
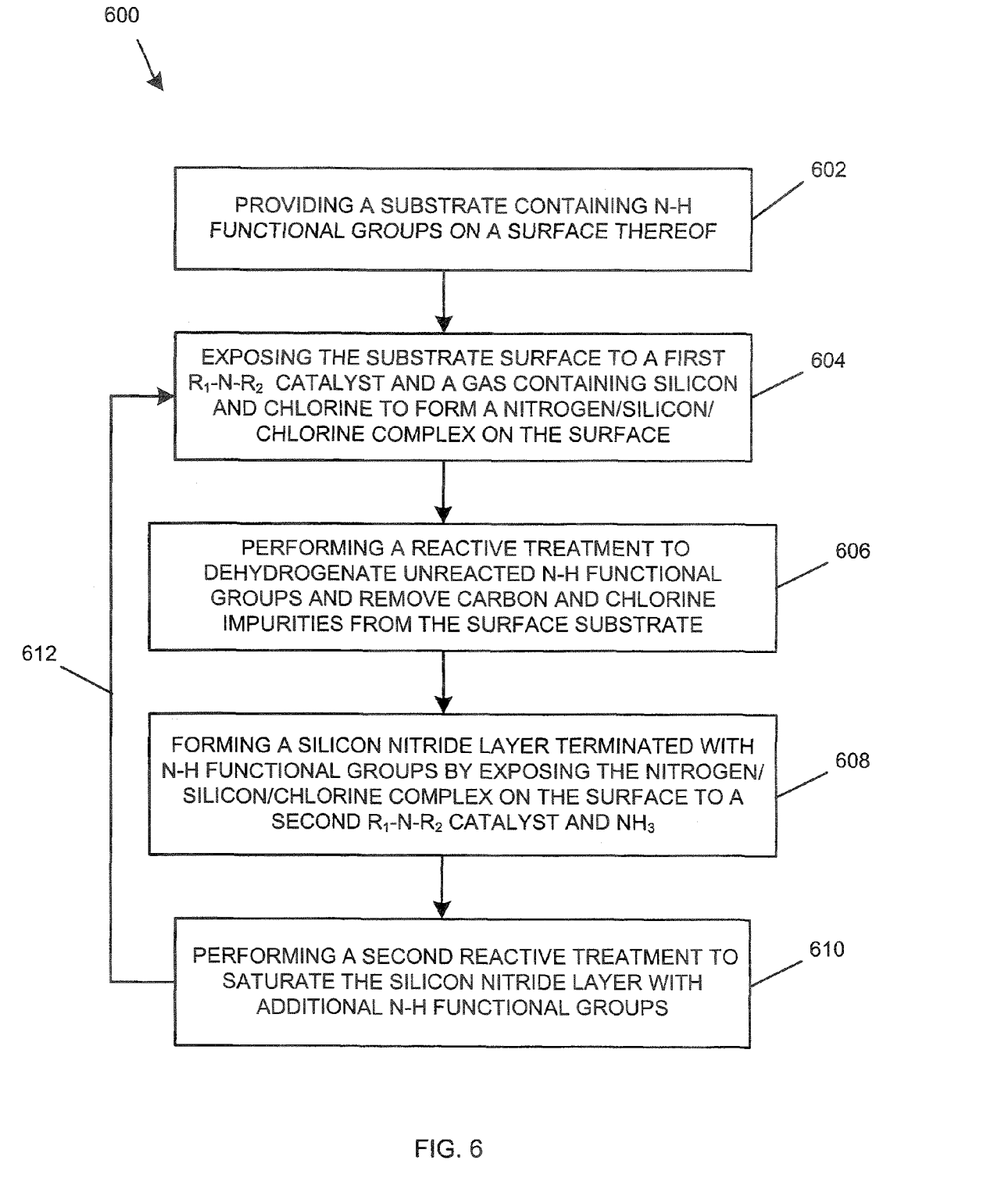

FIGS. 4-6 are process flow diagrams for forming a SiN film according to embodiments of the invention. The flow diagrams describe catalyst-assisted deposition of a SiN film on a functionalized substrate using one or more in-situ reactive treatments to remove impurities and defects during the film deposition.

FIG. 4 is a process flow diagram for forming a SiN film according to an embodiment of the invention. In FIG. 4, the process 400 includes, in step 402, providing a substrate containing N—H functional groups on a surface thereof. The substrate surface may be functionalized with N—H functional groups by exposure to ammonia (NH$_3$) and optionally UV radiation. Next, the process chamber is evacuated and purged with N$_2$ or Ar.

In step 404, the substrate surface is exposed to a first R$_1$—N—R$_2$ catalyst and a gas containing silicon and chlorine to form a nitrogen/silicon/chlorine (N—Si—Cl) complex on the surface. The length of the exposure is selected to saturate the substrate surface with the N—Si—Cl complex. Although the substrate surface is saturated with the N—Si—Cl, it is contemplated that unreacted N—H functional groups are present on the substrate surface at the end of step 404, for example due to steric hindrance effects on the substrate surface.

According embodiments of the invention, the one or more R$_1$—N—R$_2$ catalyst(s) can include pyridine (C$_5$H$_5$N), which is a cyclic aromatic compound, and tertiary amines (R$_3$N), where R can be alkyl, aryl, or aralkyl. Common tertiary amines include trimethyl amine (CH$_3$)$_3$N, triethyl amine (CH$_3$CH$_2$)$_3$N, dimethyl ethylamine (CH$_3$)$_2$(CH$_3$CH$_2$)N, and tributyl amine (CH$_3$CH$_2$CH$_2$CH$_2$)$_3$N.

In step 406, a reactive treatment is performed to dehydrogenate unreacted N—H functional groups and remove carbon and chlorine impurities from the substrate surface. According to an embodiment of the invention, the reactive treatment can include exposing the substrate surface to UV light radiation and a first reactive gas containing chlorine to dehydrogenate unreacted N—H functional groups with chlorine, thereby replacing Si—N—H functional groups with Si—Cl groups.

In step 408, a silicon nitride layer terminated with N—H functional groups is formed by exposing the nitrogen/silicon/chlorine complex on the substrate surface to a second R$_1$—N—R$_2$ catalyst and NH$_3$. NH$_3$ serves as a X—H functional group precursor (where X is nitrogen) by providing the N—H functional groups. As for the first R$_1$—N—R$_2$ catalyst in step 404, the second R$_1$—N—R$_2$ catalyst in step 408 can be selected from pyridine and tertiary amines. According to embodiments of the invention, the first and second R$_1$—N—R$_2$ catalyst may contain the same R$_1$—N—R$_2$ catalyst or, alternately, they may contain different R$_1$—N—R$_2$ catalysts.

The process steps 404-408 may be repeated as shown by process flow arrow 410 until a SiN film with a desired thickness is formed.

FIG. 5 is a process flow diagram for forming a SiN film according to an embodiment of the invention. The process 500 in FIG. 5 is similar to the process 400 of FIG. 4 and includes, in step 502, providing a substrate containing N—H functional groups on a surface thereof, and in step 504, the substrate surface is exposed to a first R$_1$—N—R$_2$ catalyst and a gas containing silicon and chlorine to form a nitrogen/silicon/chlorine complex on the surface.

In step 506, a silicon nitride layer terminated with N—H functional groups is formed by exposing the nitrogen/silicon/chlorine complex on the substrate surface to a second R$_1$—N—R$_2$ catalyst and NH$_3$.

In step 508, a reactive treatment is performed to saturate the silicon nitride layer with additional N—H functional groups by exposing the silicon nitride layer to an UV light radiation and a reactive gas comprising NH$_3$. The effects of UV radiation activation of the reactive gas enable further saturation the silicon nitride layer with additional N—H functional groups. The enhanced availability of N—H groups can be schematically shown by the following reaction:

NH$_3$+UV→NH$_2$+H

According to one embodiment of the invention, steps 506 and 508 may be sequentially carried out with no temporal overlap. According to another embodiment of the invention, steps 506 and 508 may be carried out with at least partial temporal overlap. According to one embodiment, the steps 506 and 508 may be performed simultaneously.

The process steps 504-508 may be repeated as shown by process flow arrow 510 until a SiN film with a desired thickness is formed.

FIG. 6 is a process flow diagram for forming a SiN film according to an embodiment of the invention. The process 600 in FIG. 3 includes both the reactive treatments steps 406, 508 of the processes 400, 500 in FIGS. 4, 5. The process 600 includes, in step 602, providing a substrate containing N—H functional groups on a surface thereof, and in step 604, the substrate surface is exposed to a first R$_1$—N—R$_2$ catalyst and a gas containing silicon and chlorine to form a nitrogen/silicon/chlorine complex on the surface.

In step 606, a reactive treatment is performed to dehydrogenate unreacted N—H functional groups and remove carbon and chlorine impurities from the substrate surface. According to an embodiment of the invention, the reactive treatment can include exposing the substrate surface to UV light radiation and a first reactive gas containing chlorine to dehydrogenate unreacted N—H functional groups with chlorine, thereby replacing Si—N—H functional groups with Si—Cl groups.

In step 608, a silicon nitride layer terminated with N—H functional groups is formed by exposing the nitrogen/silicon/chlorine complex on the substrate surface to a second R$_1$—N—R$_2$ catalyst and NH$_3$.

In step 610, a reactive treatment is performed to saturate the silicon nitride layer with additional N—H functional groups by exposing the silicon nitride layer to an UV light radiation and a reactive gas comprising NH$_3$.

According to one embodiment of the invention, steps 606 and 608 may be sequentially carried out with no temporal overlap. According to another embodiment of the invention, steps 606 and 608 may be carried out with at least partial temporal overlap. According to one embodiment, the steps 606 and 608 may be performed simultaneously.

Figure 7:
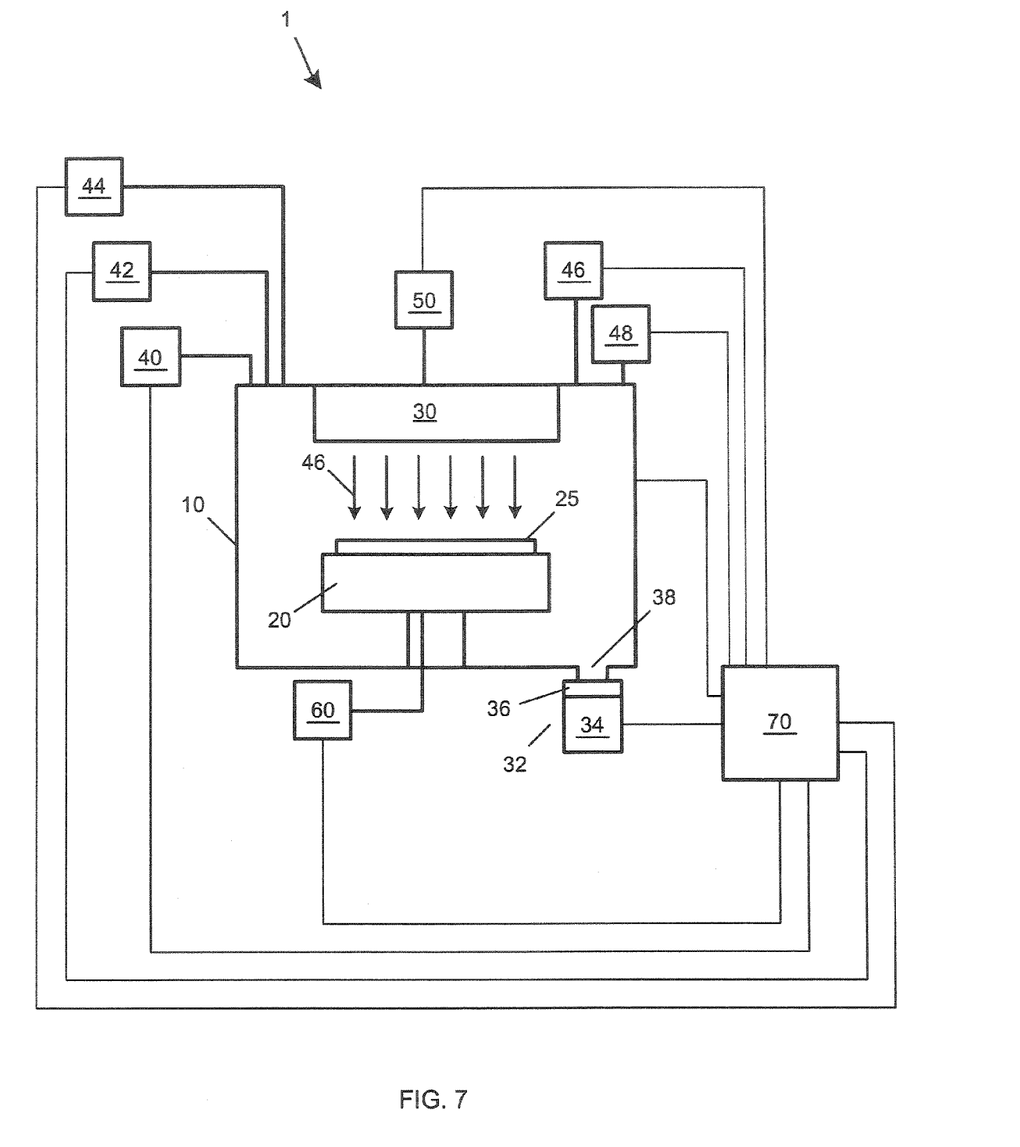
FIG. 7 depicts a schematic view of an ALD system configured for forming silicon-containing films according to embodiments of the invention.

FIG. 7 depicts a schematic view of an ALD system according to an embodiment of the invention. The ALD system 1 includes a process chamber 10 having a substrate holder 20 configured to support a substrate 25, upon which the silicon-containing film is formed. Coupled to the process chamber 10 are a first process material supply system 40 configured for delivering a gas containing silicon and chlorine to the process chamber 10, a second process material supply system 42 configured for delivering H$_2$O, H$_2$O$_2$, or both H$_2$O and H$_2$O$_2$, or NH$_3$, a purge gas supply system 44 configured for supplying a purge gas, a third process material supply system 46 configured for delivering a R$_1$—O—R$_2$ catalyst or a R$_1$—O—R$_2$ catalyst, and a fourth gas supply system 48 configured for delivering O$_3$ to the process chamber 10. The fourth gas supply system 48 may contain a remote O$_3$ microwave generator. Although not shown in FIG. 7, the ALD system 1 may contain a showerhead gas injection plate or an annular ring with a plurality of holes for introducing gases into the process chamber 10.

The material supply systems 40, 42, 46, 48, and the purge gas supply system 44 can include one or more material sources, one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. The material supply systems 40, 42, 46, 48, and the purge gas supply system 44 can be configured to alternately or simultaneously introduce gases to process chamber 10 with or without the use of a carrier gas. The alternation of the introduction of the first material and the introduction of the second material can be cyclical, or it may be acyclical with variable time periods between introduction of the first and second materials. The first process material is configured to provide a gas containing silicon and chlorine. The second process material supply system is configured to provide a gas containing $H_2O$, $H_2O_2$, or $O_3$, or a combination thereof to the process chamber 10.

The process chamber 10 further comprises a radiation assembly 30 containing a light source for irradiating the substrate 25 with UV light radiation. The light source may be a device such as a laser or a lamp. The radiation assembly 30 can be configured to irradiate the whole surface of the substrate 25 facing the radiation assembly 30 or the light can be focused to irradiate only a portion of the surface 25. Additionally, the ALD system 1 contains a power source 50 coupled to the radiation assembly 30.

According to one embodiment of the invention, the radiation assembly 30 is configured to form and expose the substrate 25 to UV light radiation 46 that is collimated with light rays that are substantially parallel to each other. Radiation assemblies capable of producing collimated light radiation are well known to those skilled in the art. For example, the collimated light of light radiation 46 can be formed by collimating diffuse light radiation from one or more light radiation sources housed in the radiation assembly 30 using a condenser lens, or other devices such as one or more baffles. For example, the radiation assembly 30 can be capable of generating an output between about 10 $mW/cm^2$ and about 1000 $mW/cm^2$. According to another embodiment of the invention, the output can be between about 50 $mW/cm^2$ and about 500 $mW/cm^2$. According to another embodiment of the invention, the radiation assembly 30 can be configured to expose the substrate 25 to light radiation 46 that is diffuse and nearly isotropic (i.e., not strongly directional). In other words, the light radiation 46 that is diffuse is not predominantly incident to the substrate 25 from any particular direction. It is contemplated that diffuse light radiation may be more effective than collimated light radiation in altering or enhancing the film deposition mechanism in vias and trenches formed in substrates, particularly in high aspect ratio vias and trenches where the use of collimated light radiation can result in low irradiation levels of the sidewalls of the vias and trenches. Radiation assemblies capable of producing diffuse light radiation are well known to those skilled in the art. For example, the radiation assembly 30 can be capable of generating an output between about 10 $mW/cm^2$ and about 1000 $mW/cm^2$. According to another embodiment of the invention, the output can be between about 50 $mW/cm^2$ and about 500 $mW/cm^2$. Although not shown in FIG. 7, the radiation assembly 30 may contain a plurality of light sources for providing a wide variety of wavelengths from the electromagnetic spectrum, either simultaneously or sequentially. The radiation assembly 30 is configured to permit light pulsing, or a shutter may be positioned between the radiation assembly 30 and the substrate 25 to permit irradiation of the substrate 25 by opening and closing the shutter.

Furthermore, the ALD system 1 includes a controller 70 that can be coupled to process chamber 10, substrate holder 20, radiation assembly 30, process material supply systems 40, 42, 46, and 48, purge gas supply system 44, power source 50, and substrate temperature control system 60. Alternatively, or in addition, controller 70 can be coupled to one or more additional controllers/computers (not shown), and controller 70 can obtain setup and/or configuration information from an additional controller/computer.

In FIG. 7, singular processing elements (10, 20, 30, 40, 42, 44, 46, 48, 50, and 60) are shown, but this is not required for the invention. The ALD system 1 can include any number of processing elements having any number of controllers associated with them in addition to independent processing elements.

The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 7, the ALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The purge gas supply system 44 can be configured to introduce a purge gas to process chamber 10. For example, the introduction of purge gas may occur between introduction of the steps described in the process flow diagrams of FIGS. 1-6. The purge gas can comprise an inert gas, such as a noble gas (i.e., helium, neon, argon, xenon, krypton), or nitrogen ($N_2$), or hydrogen ($H_2$). Although not shown in FIG. 7, the purge gas supply system 44 may be further configured for purging a light transparent window (not shown) of the radiation assembly 30 in the process chamber 10 that faces the substrate 25. The light transmissive window transmits the diffuse or collimated light radiation 46 and, in the absence of a purge, may become coated from the process being performed in the process chamber 10, thereby reducing the intensity of the diffuse radiation 45 that reaches the substrate 25. In FIG. 7, the radiation assembly 30 is shown disposed in the process chamber 10 but this is not required for embodiments of the invention as the radiation assembly 30 may be provided outside the process chamber and a light transmissive window utilized to transmit the diffuse light radiation and provide a vacuum seal between the atmosphere and the vacuum environment inside the process chamber 10.

Additionally, the ALD system 1 includes a substrate temperature control system 60 coupled to substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the ALD system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

Still referring to FIG. 7, controller 70 can comprise a microprocessor, memory, and a digital I/O port capable of generating control voltages sufficient to communicate and activate inputs to deposition system 1 as well as monitor outputs from ALD system 1. Moreover, the controller 70 may be coupled to and may exchange information with the process chamber 10, substrate holder 20, radiation assembly 30, process material supply systems 40, 42, 46, and 48, purge gas supply system 44, power source 50, substrate temperature controller 60, and pressure control system 32. For example, a program stored in the memory may be utilized to activate the inputs to the aforementioned components of the ALD system 1 according to a process recipe in order to perform an etching process, or a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the ALD system 1, or it may be remotely located relative to the ALD system 1. For example, the controller 70 may exchange data with the ALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the ALD system 1 via a wireless connection.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

As should be apparent from the discussion above, embodiments of the present invention can provide low temperature catalyst-assisted deposition of silicon-containing films having reduced film impurity and defect levels, which prior art methods are unable to accomplish without high-temperature post-deposition film processing.

What is claimed is:

1. A method of depositing a silicon-containing film, the method comprising:
    providing a substrate comprising O—H functional groups on a surface thereof;
    exposing the substrate surface to a first $R_1$—O—$R_2$ catalyst and a gas containing silicon and chlorine to form a oxygen/silicon/chlorine complex on the surface;
    forming a silicon-O layer terminated with O—H functional groups by exposing the oxygen/silicon/chlorine complex on the substrate surface to a second $R_1$—O—$R_2$ catalyst and a O—H functional group precursor; and
    performing a reactive treatment to saturate the silicon-O layer with additional O—H functional groups.

2. The method of claim 1, wherein the gas containing silicon and chlorine comprises a chlorosilane or a chlorodisilane.

3. The method of claim 1, wherein the reactive treatment has at least partial temporal overlap with the forming.

4. The method of claim 1, wherein
    the exposing comprises exposing the substrate surface to a first $R_1$—O—$R_2$ catalyst and a gas containing silicon and chlorine to form an oxygen/silicon/chlorine complex on the surface,
    the forming comprises forming a silicon oxide layer terminated with hydroxyl functional groups by exposing the oxygen/silicon/chlorine complex on the substrate surface to a second $R_1$—O—$R_2$ catalyst and $H_2O$, and
    the performing comprises performing a reactive treatment to saturate the silicon oxide layer with additional hydroxyl functional groups.

5. The method of claim 4, wherein the performing comprises exposing the silicon oxide layer to ultra-violet light radiation and a reactive gas comprising $H_2O$, $H_2O_2$, or $O_3$, or a combination thereof.

6. The method of claim 1, wherein the silicon-containing film is deposited on a component of a microelectronic device, on a high aspect ratio trench capacitor as an interface layer, on a substrate for a flat panel display, in a multilayer structure, in a nanolaminate structure, or on a polymeric or biological material as a protective coating or insulator.

7. A method of depositing a silicon-containing film, the method comprising:
    providing a substrate comprising X—H functional groups on a surface thereof;
    exposing the substrate surface to a first $R_1$—X—$R_2$ catalyst and a gas containing silicon and chlorine to form a X/silicon/chlorine complex on the surface;
    forming a silicon-X layer terminated with X—H functional groups by exposing the X/silicon/chlorine complex on the substrate surface to a second $R_1$—X—$R_2$ catalyst and a X—H functional group precursor; and
    performing a reactive treatment to saturate the silicon-X layer with additional X—H functional groups;
    wherein X is O,
    wherein the exposing comprises exposing the substrate surface to a first $R_1$—O—$R_2$ catalyst and a gas containing silicon and chlorine to form an oxygen/silicon/chlorine complex on the surface, the forming comprises forming a silicon oxide layer terminated with hydroxyl functional groups by exposing the oxygen/silicon/chlorine complex on the substrate surface to a second $R_1$—O—$R_2$ catalyst and $H_2O$, and the performing comprises performing a reactive treatment to saturate the silicon oxide layer with additional hydroxyl functional groups; and
    wherein the first and second $R_1$—O—$R_2$ catalysts are selected from the group consisting of furan and ethers.

* * * * *